(12) United States Patent
Craninckx

(10) Patent No.: US 7,298,790 B2
(45) Date of Patent: Nov. 20, 2007

(54) LOW FREQUENCY SELF-CALIBRATION OF A PLL WITH MULTIPHASE CLOCKS

(75) Inventor: Jan Frans Lucien Craninckx, Boutersem (BE)

(73) Assignee: STMicroelectronics Belgium N.V., Zaventem (BE)

( * ) Notice: Subject to any disclaimer, the term of this patent is extended or adjusted under 35 U.S.C. 154(b) by 693 days.

(21) Appl. No.: 10/718,256

(22) Filed: Nov. 20, 2003

(65) Prior Publication Data

US 2004/0180638 A1    Sep. 16, 2004

(30) Foreign Application Priority Data

Nov. 21, 2002   (EP)   .................. 02447228

(51) Int. Cl.
   *H04L 25/49*   (2006.01)
(52) U.S. Cl. ...................................... 375/294
(58) Field of Classification Search ................ 375/354,
   375/371, 373, 374, 375, 376, 316, 322, 324,
   375/327, 294, 293, 286; 329/304, 306, 307;
   332/117, 123, 126, 127; 342/73, 89, 98,
   342/100, 102, 103
   See application file for complete search history.

(56) References Cited

U.S. PATENT DOCUMENTS 6,064,272 A    5/2000   Rhee 6,181,213 B1    1/2001   Chang

FOREIGN PATENT DOCUMENTS

EP    1 133 060    9/2001

OTHER PUBLICATIONS

Park, Chan-Hong, "A 1.8-GHz Self-Calibrated Phase-Locked Loop with Precise I/Q Matching", IEEE Journal of Solid-State Circuits, vol. 36, No. 5, May 2001, pp. 777-783, XP002241677.
European Search Report dated May 20, 2003 for European Application No. 02447228.4.

*Primary Examiner*—Pankaj Kumar
(74) *Attorney, Agent, or Firm*—Lisa K. Jorgenson; Stephen Bongini; Fleit Kain Gibbons Gutman Bongini & Bianco P.L.

(57) ABSTRACT

A Phase-Locked Loop with multiphase clocks is provided. The Phase-Locked Loop includes a main loop, a calibration loop, and Control Logic. The main loop includes, coupled in series, a Phase Frequency Detector, a Main Charge Pump, a Main Loop Filter, a Multi-Phase Voltage Controlled Oscillator and a Phase-switching Fractional Divider. The calibration loop is coupled to the Phase Frequency Detector, and comprises a Calibration Charge Pump, a Demultiplexer and Y Calibration Loop Filters, with Y being an integer. The Control Logic controls the Phase-Switching Fractional Divider and the Demultiplexer. A Reference Frequency Signal is coupled to the Phase Frequency Detector and a Calibration Signal is coupled to the calibration loop. The main loop further comprises a Phase-adjusting Block coupled to a Multiplexer. The Phase-adjusting Block is arranged so as to receive at least one correction signal from the calibration loop.

16 Claims, 1 Drawing Sheet

LOW FREQUENCY SELF-CALIBRATION OF A PLL WITH MULTIPHASE CLOCKS

CROSS-REFERENCE TO RELATED APPLICATIONS

This application is based upon and claims priority from European Patent Application No. 02-447228.4, filed Nov. 21, 2002, the entire disclosure of which is herein incorporated by reference.

FIELD OF THE INVENTION

The present invention is related to a fractional-N frequency synthesizer used in digital communication systems. More precisely, it relates to a frequency synthesizer based on a Phase-Locked Loop (PLL) with multiphase clocks, in which a self-calibrating loop is used.

BACKGROUND OF THE INVENTION

In many applications, e.g., in mobile radio systems, it is necessary to synthesize frequencies in a digital way, i.e., using a Phase-Locked Loop. A conventional integer-N frequency synthesizer produces an output frequency that is N times the input reference frequency, such that its frequency resolution is the same as the PLL reference frequency. Therefore, narrow channel spacing is accompanied by a small loop bandwidth, which leads to long settling times. With a fractional-N frequency synthesizer, an output frequency is generated that is N+X/Y times the input reference frequency, i.e., a fractional multiple of the reference frequency, such that narrow channel spacing is achieved along with a higher phase detector frequency. If Y is not too big the fractional-N frequency synthesizer can be based on multiphase clock signals. The Voltage Controlled Oscillator (VCO) then disposes of Y copies of the signal, each shifted over $2\pi/Y$. The value of X then determines at which instances a VCO output pulse is generated.

Several major drawbacks arise from this approach. A mismatch between the various clock signal phases causes reduced quadrature accuracy, if the phases are used in an image-reject transceiver. Further, when the PLL is locked, the delay mismatches introduce periodic phase errors that give rise to fractional spurs in the output frequency spectrum, resulting in an out-of-spec transmitter spectrum and in a reduced interference capability in the receiver. A solution to this problem is suggested in IEEE JSSC, Vol. 36, No. 5, May 2001, pp. 777-783. It consists in adding to the PLL a self-calibrating loop to eliminate the delay mismatches. The calibration loop adjusts the phases of the multiphase clock signal based on the timing information present in the phase frequency detector (PFD) outputs. The calibration loop has a much smaller bandwidth in order to avoid disturbance of the locking behavior of the main loop. A safe solution here is to activate the calibration loop only when the main loop is locked. In the calibration loop there is a multiplexing switch that guides the current coming out of the calibration charge pump towards one of the Y calibration loop filters. Which one of the Y calibration loop filters is to be selected is determined by a control logic that knows which phase is currently selected by the phase-switching fractional divider and thus knows which phase must be calibrated.

To adjust the phase of the multiphase clocks, extra circuitry must be inserted in the VCO or in the high-speed divide-by-2 prescalers. This inevitably slows down these circuits, resulting in lower maximum operating frequency and/or higher power consumption.

SUMMARY OF THE INVENTION

In view of these drawbacks, it is an object of the present invention to overcome the above-mentioned drawbacks and to provide a device that synthesises a fractional-N frequency based on a Phase Locked Loop (PLL) with multiphase clocks, in which a self-calibrating loop is used in such a way that the fractional spurs problem is overcome.

One embodiment of the present invention provides a Phase-Locked Loop with multiphase clocks. The Phase-Locked Loop includes a main loop, a calibration loop, and Control Logic. The main loop includes, coupled in series, a Phase Frequency Detector, a Main Charge Pump, a Main Loop Filter, a Multi-Phase Voltage Controlled Oscillator and a Phase-switching Fractional Divider. The calibration loop is coupled to the Phase Frequency Detector, and comprises a Calibration Charge Pump, a Demultiplexer and Y Calibration Loop Filters, with Y being an integer. The Control Logic controls the Phase-Switching Fractional Divider and the Demultiplexer. A Reference Frequency Signal is coupled to the Phase Frequency Detector and a Calibration Signal is coupled to the calibration loop. The main loop further comprises a Phase-adjusting Block coupled to a Multiplexer. The Phase-adjusting Block is arranged so as to receive at least one correction signal from the calibration loop. Preferably, the Control Logic also controls the Demultiplexer.

According to one embodiment of the present invention, the Phase-adjusting Block comprises Y Low-frequency Delay Cells controlled by the Y Calibration Loop Filters.

Preferably, the correction signal is a delay, specific to a phase, and is contained in the low-frequency delay cell corresponding to the phase.

Another embodiment of the present invention provides method for synthesizing frequencies with such a Phase-Locked Loop with multiphase clocks. According to the method, at least one such Phase-Locked Loop is provided. A reference frequency signal is coupled to the Phase Frequency Detector of the Phase-Locked Loop, and a Calibration Signal is coupled to the calibration loop of the Phase-Locked Loop.

According to a first preferred embodiment of the present invention, the PLL is part of a fractional-N frequency synthesizer.

In one advantageous embodiment, the PLL is part of an integrated circuit.

In another preferred embodiment, the PLL is part of a digital mobile radio communication apparatus.

Other objects, features and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention relate to a Phase-Locked Loop (PLL) with multiphase clocks, in which a self-calibrating loop is used. If it is just desired to solve the problem of the fractional spurs, the extra circuitry to adjust the phase of the multiphase clocks is advantageously moved to the low frequency domain at the output of the phase-switching fractional divider. The calibration then is done with low-frequency blocks, resulting in higher maximum operating speed and/or lower power consumption.

Figure 1:
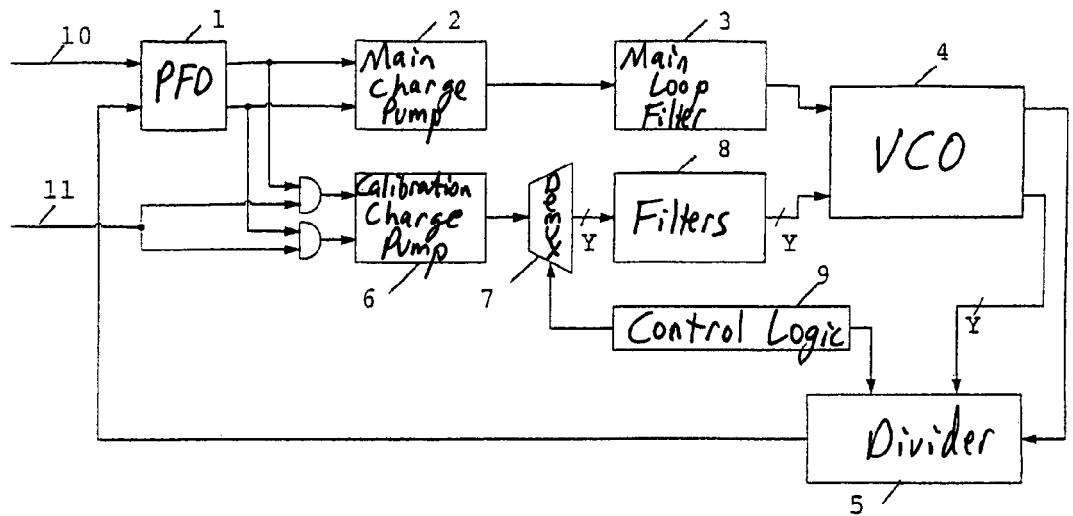
FIG. 1 represents the prior art solution.

FIG. 1 shows the prior art solution. As shown, a first (Main) loop comprises, coupled in cascade, a Phase Frequency Detector (PFD) 1, a Main Charge Pump 2, a Main Loop Filter 3, a Multi-Phase Voltage Controlled Oscillator (VCO) 4 and a Phase-switching Fractional Divider 5. A second (Calibration) loop comprises the series connection of a Calibration Charge Pump 6, a Demultiplexer 7 and Y Calibration Loop Filters 8, with Y being an integer, coupled between the Phase Frequency Detector (PFD) 1 and the Multi-Phase Voltage Controlled Oscillator (VCO) 4. The Demultiplexer 7 is controlled by Control Logic 9 coupled to the Phase-Switching Fractional Divider 5. A Reference Frequency Signal 10 is applied to the Phase Frequency Detector 1. The Calibration signal 11 is applied to a control input of the Control Logic 9.

Figure 2:
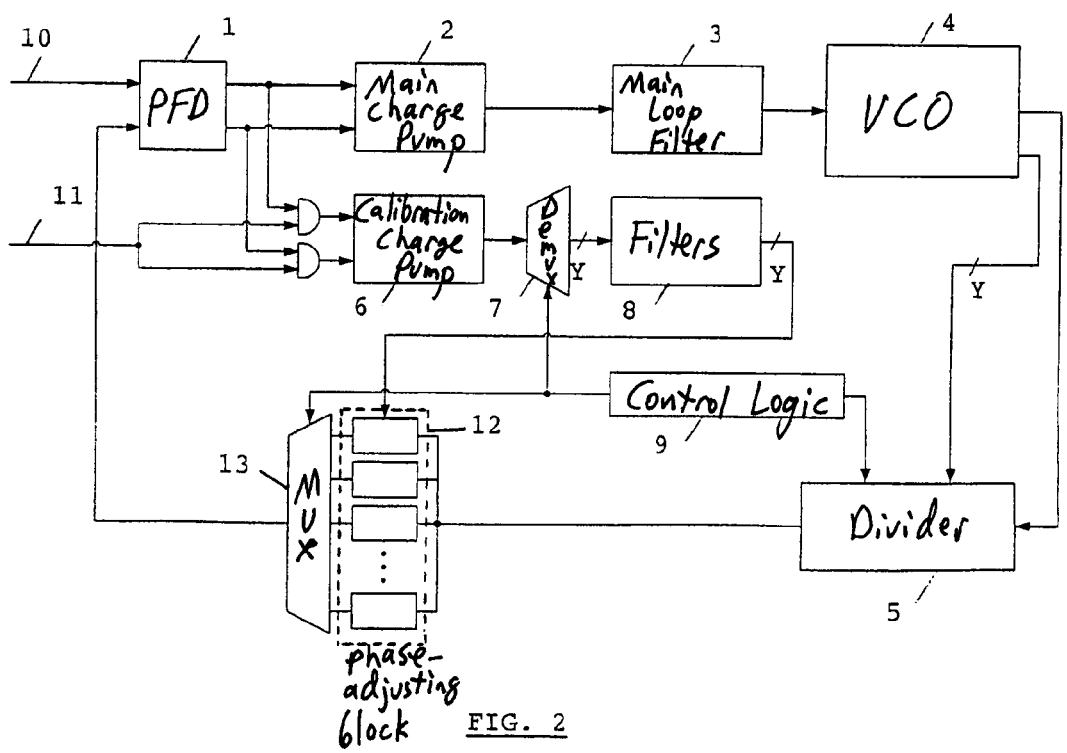
FIG. 2 represents one embodiment of the present invention.

FIG. 2 shows the block scheme of one embodiment of the present invention. The Main Loop 15 remains the same. The second (Calibration) loop still comprises the series connection of a Calibration Charge Pump 6, a Demultiplexer 7 and Y Calibration Loop Filters 8, with Y being an integer. The input still comes from the Phase Frequency Detector (PFD) 1, but the output is not connected to the Multi-Phase Voltage Controlled Oscillator (VCO), but is instead connected to a phase-adjusting block 12 that is positioned after the Phase-Switching Fractional Divider 5, i.e., at lower frequency. As in the prior art (FIG. 1), the Control Logic 9 selects the correct loop filter [1:Y] of the phase to be calibrated, based on the state that the Phase-Switching Fractional Divider 5 is in. This is done with the demultiplexer following the calibration charge pump 6. Additionally, the same Control Logic 9 also selects in the phase-adjusting block 12 the corresponding low-frequency delay cell T[1:Y] that is associated with this phase. This is done with the multiplexer 13 shown in the block diagram.

The multi-phase VCO 4 can now be "non-calibratable": the calibration loop now does not adjust the phases of the VCO directly, but instead adjusts the amount of delay given by the low-frequency delay cells $\Delta T[1:Y]$. If phase [i] of the VCO has an error of $\Delta\phi[i]$ with respect to the ideal (matched) phase it should have, this is compensated by an equivalent delay (of the opposite sign) in the low-frequency delay cell. Because of this the phases at the input of the phase detector are mismatch-free and thus perfectly aligned. The fractional spurs in the output spectrum are thereby removed.

The PLL described above can advantageously be applied in a fractional-N frequency synthesizer.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A Phase-Locked Loop with multiphase clocks for use in a digital system, said Phase-Locked Loop comprising:
    a main loop comprising, coupled in series, a Phase Frequency Detector, a Main Charge Pump, a Main Loop Filter, a Multi-Phase Voltage Controlled Oscillator and a Phase-switching Fractional Divider;
    a calibration loop coupled to the Phase Frequency Detector, the calibration loop comprising a Calibration Charge Pump, a Demultiplexer and Y Calibration Loop Filters, with Y being an integer; and
    Control Logic for controlling the Phase-Switching Fractional Divider and the Demultiplexer,
    wherein the Phase Frequency Detector includes an input for receiving a Reference Frequency Signal,
    a Calibration Signal is coupled to the calibration loop, and the main loop further comprises a Phase-adjusting Block coupled to a Multiplexer, the Phase-adjusting Block including at least one input for receiving at least one correction signal from the calibration loop.

2. The Phase-Locked Loop according to claim 1, wherein the Phase-adjusting Block comprises Y Low-frequency Delay Cells controlled by the Y Calibration Loop Filters.

3. The Phase-Locked Loop according to claim 2, wherein the at least one correction signal is a delay, specific to a phase, and corresponds to the Low-frequency Delay Cell corresponding to the phase.

4. A fractional-N frequency synthesizer comprising the Phase-Locked Loop according to claim 1.

5. An integrated circuit comprising at least one Phase-Locked Loop according to claim 1.

6. A digital mobile radio communication apparatus including at least one Phase-Locked Loop with multiphase clocks, said Phase-Locked Loop comprising:
    a main loop comprising, coupled in series, a Phase Frequency Detector, a Main Charge Pump, a Main Loop Filter, a Multi-Phase Voltage Controlled Oscillator and a Phase-switching Fractional Divider;
    a calibration loop coupled to the Phase Frequency Detector, the calibration loop comprising a Calibration Charge Pump, a Demultiplexer and Y Calibration Loop Filters, with Y being an integer; and
    Control Logic for controlling the Phase-Switching Fractional Divider and the Demultiplexer,
    wherein the Phase Frequency Detector includes an input for receiving a Reference Frequency Signal,
    a Calibration Signal is coupled to the calibration loop, and the main loop further comprises a Phase-adjusting Block coupled to a Multiplexer, the Phase-adjusting Block including at least one input for receiving at least one correction signal from the calibration loop.

7. The digital mobile radio communication apparatus according to claim 6, wherein the Phase-adjusting Block of said Phase-Locked Loop comprises Y Low-frequency Delay Cells controlled by the Y Calibration Loop Filters.

8. The digital mobile radio communication apparatus according to claim 7, wherein the at least one correction signal is a delay, specific to a phase, and corresponds to the Low-frequency Delay Cell corresponding to the phase.

9. The digital mobile radio communication apparatus according to claim 6, further including at least one fractional-N frequency synthesizer that comprises said Phase-Locked Loop.

10. The digital mobile radio communication apparatus according to claim 6, further including at least one integrated circuit that comprises said Phase-Locked Loop.

11. A method for synthesizing frequencies in a digital system using a Phase-Locked Loop with multiphase clocks, said method comprising the steps of:
   providing at least one Phase-Locked Loop in the digital system, the Phase-Locked Loop including:
      a main loop comprising, coupled in series, a Phase Frequency Detector, a Main Charge Pump, a Main Loop Filter, a Multi-Phase Voltage Controlled Oscillator and a Phase-switching Fractional Divider;
      a calibration loop coupled to the Phase Frequency Detector, the calibration loop comprising a Calibration Charge Pump, a Demultiplexer and Y Calibration Loop Filters, with Y being an integer; and
      Control Logic for controlling the Phase-Switching Fractional Divider and the Demultiplexer,
      wherein the main loop further comprises a Phase-adjusting Block coupled to a Multiplexer, the Phase-adjusting Block including at least one input for receiving at least one correction signal from the calibration loop; and
   synthesizing frequencies in the digital system using the Phase-Locked Loop by applying a reference frequency signal to the Phase Frequency Detector of the Phase-Locked Loop, and applying a Calibration Signal to the calibration loop of the Phase-Locked Loop.

12. The method according to claim 11, wherein the Phase-adjusting Block comprises Y Low-frequency Delay Cells controlled by the Y Calibration Loop Filters.

13. The method according to claim 12, wherein the at least one correction signal is a delay, specific to a phase, and corresponds to the Low-frequency Delay Cell corresponding to the phase.

14. The method according to claim 11, wherein a fractional-N frequency synthesizer comprises the Phase-Locked Loop.

15. The method according to claim 11, wherein an integrated circuit comprises the Phase-Locked Loop.

16. The method according to claim 11, wherein a digital mobile radio communication apparatus comprises the Phase-Locked Loop.

* * * * *